United States Patent
Kim

(10) Patent No.: US 7,188,484 B2
(45) Date of Patent: Mar. 13, 2007

(54) HEAT DISSIPATING STRUCTURE FOR MOBILE DEVICE

(75) Inventor: Ye-Yong Kim, Suwon-si (KR)

(73) Assignee: LG Electronics Inc., Seoul (KR)

( * ) Notice: Subject to any disclaimer, the term of this patent is extended or adjusted under 35 U.S.C. 154(b) by 302 days.

(21) Appl. No.: 10/786,308

(22) Filed: Feb. 26, 2004

(65) Prior Publication Data

US 2004/0244397 A1 Dec. 9, 2004

(30) Foreign Application Priority Data

Jun. 9, 2003 (KR) ............... 10-2003-0036894
Jul. 28, 2003 (KR) ............... 10-2003-0052036

(51) Int. Cl.
*F25D 23/12* (2006.01)
*H05K 7/20* (2006.01)

(52) U.S. Cl. ............... 62/259.2; 361/700; 165/104.33

(58) Field of Classification Search ............... 62/259.2; 165/104.33, 80.4; 361/687, 688, 689, 690, 361/700, 707, 715, 818
See application file for complete search history.

(56) References Cited

U.S. PATENT DOCUMENTS

| | | | |
|---|---|---|---|
| 6,166,908 A | 12/2000 | Samaras et al. | 361/700 |
| 6,328,097 B1 | 12/2001 | Bookhardt et al. | 165/104.33 |
| 6,351,382 B1 | 2/2002 | Nakanishi et al. | 361/700 |
| 6,377,219 B2 * | 4/2002 | Smith | 343/702 |
| 6,400,565 B1 | 6/2002 | Shabbir et al. | 361/687 |
| 6,437,981 B1 * | 8/2002 | Newton et al. | 361/700 |
| 6,997,241 B2 * | 2/2006 | Chou et al. | 165/80.3 |
| 2002/0167799 A1 | 11/2002 | Kawashima et al. | 361/700 |
| 2003/0016500 A1 | 1/2003 | Malone et al. | 361/701 |

FOREIGN PATENT DOCUMENTS

| | | |
|---|---|---|
| CN | 1347281 | 5/2002 |
| CN | 1364251 | 8/2002 |
| CN | 2515800 | 10/2002 |
| JP | 11143585 A * | 5/1999 |
| JP | 2002-278654 | 9/2002 |

OTHER PUBLICATIONS

David A. Reay, Heat Pipe, in AccessScience@McGraw-Hill, http://www.accessscience.com, DOI 10. 1036/1097-8542. 757297, May 13, 2002.
Charles A. Harper, Cooling with Heat Pipes, Electronic packaging & Interconnection Handbook, pp. 2.79-2.80, McGraw Hill, 1997.

* cited by examiner

*Primary Examiner*—Chen Wen Jiang
(74) *Attorney, Agent, or Firm*—Fleshner & Kim, LLP

(57) ABSTRACT

Embodiments of a heat dissipating structure and method for a mobile device can cool components of a mobile terminal. The heat-dissipating structure can include a case, a device mounted in the case that generates heat in connection with its operation, and a cooling unit. The cooling unit can include a housing having a refrigerant therein, a first heat exchanging part for absorbing the heat through a thermal contact with the device and a second heat exchanging part for dissipating the heat.

29 Claims, 7 Drawing Sheets

HEAT DISSIPATING STRUCTURE FOR MOBILE DEVICE

BACKGROUND OF THE INVENTION

1. Field of the Invention

The present invention relates to a mobile device, more particularly, to a heat dissipating structure of a mobile device for dissipating heat generated in the mobile device.

2. Background of the Related Art

A mobile device is to be carried by a user and to be used while carried or when necessary. Thus, research has been concentrated on manufacturing a smaller and lighter mobile device so as to be portable.

FIG. 1 shows a prior art mobile device, which is called PDA (Portable Digital Assistant). A shown in FIG. 1, an external appearance of the mobile device is formed by a case 1. The case 1 has a front part and a rear part and components are mounted in the space therebetween.

A screen 3 is provided at a front of the case 1. The screen 3 is the part on which various kinds of information is displayed and where the information is input by an input device such as input pen (not shown). Thus, the screen 3 has an input device recognizing function.

Some buttons 5 are arranged on the outside surface of the case 1. The buttons 5 can be many kinds of buttons such as a button for turning on/off an electric supply or a button for performing a special function at one time.

An antenna 7 is provided for the mobile device having a communication function. The antenna 7 serves to perform a proper reception of a communication signal. The antenna 7 is generally established to protrude from the upper end of the case 1.

As described above, the prior art mobile device has various disadvantages. For example, the total size of the mobile device should be made much smaller and much lighter for a good portability. However, if the mobile device is made smaller and lighter, the space in which the components are mounted becomes reduced, so that it is difficult to present an effective layout of the components.

Further, in the mobile device with the communication function, considerable heat is generated from a module performing the communication. Thus, in order to perform every function thereof as designed, such heat should be effectively dissipated out of the mobile device including from the communication module. Also, surface temperature should be strictly regulated because of the characteristics of the product in that the mobile device is used on the hands and outside.

In addition, although a fan is mainly used for dissipating the heat in the electronics, it is difficult or almost impossible to mount the fan for heat radiation in the mobile device because of the size, space and weight requirements of the portable mobile device. However, prior art mobile devices such as PDAs do not include a heat dissipation system. In addition, in case of a portable terminal such as cellular phone or smart phone, which is generally very small, it also shows pattern of abrupt and great heat generation in its intermittent use. Thus, it is difficult to use conventional cooling devices because of to the small size thereof and the various patterns of heat generation.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide heat radiation or dissipation in a mobile device.

Another object of the present invention is to provide a cooling device and method capable of dissipating the heat out of the electronics with characteristics of intermittent heat generation.

In order to achieve at least the above objects and advantages in a whole or in part, in accordance with one aspect of the present invention there is provided a mobile device for a mobile communication system that includes a case, a communication module mounted in the case that generates heat in connection with operations, and a heat dissipation system coupled to the communication module to reduce a temperature thereof during the operations.

To further achieve at least the above objects in a whole or in part, in accordance with one aspect of the present invention there is provided a micro-cooling heat dissipation system that includes a housing having a refrigerant contained within a closed system, wherein the closed system includes a coolant reservoir, a first heat exchanger coupled to the coolant reservoir configured to absorb heat through a thermal contact, a second heat exchanger operatively coupled to first heat exchanger that is configured to dissipate the heat, a liquid state refrigerant flow part coupled between the second heat exchanger and the coolant reservoir, and an insulation part between the liquid state refrigerant flow part and each of the coolant reservoir and the first and second heat exchangers.

To further achieve at least the above objects in a whole or in part, in accordance with one aspect of the present invention there is provided a mobile terminal for a mobile communication system that includes a case, a device mounted in the case that generates heat in connection with operations, and a heat dissipation system coupled to the device to reduce a temperature thereof during the operations, wherein the heat dissipation system includes a heat transfer part including a phase change material (PCM) part that effects phase changes when a predetermined temperature is reached by the heat transferred through the contact with the device.

To further achieve at least the above objects in a whole or in part, in accordance with one aspect of the present invention there is provided a personal digital assistant (PDA) that includes a display screen housed with in a case, an input device, an antenna, a controller operatively coupled to the display screen, the input device and the antenna, and a heat dissipation system coupled to the controller.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
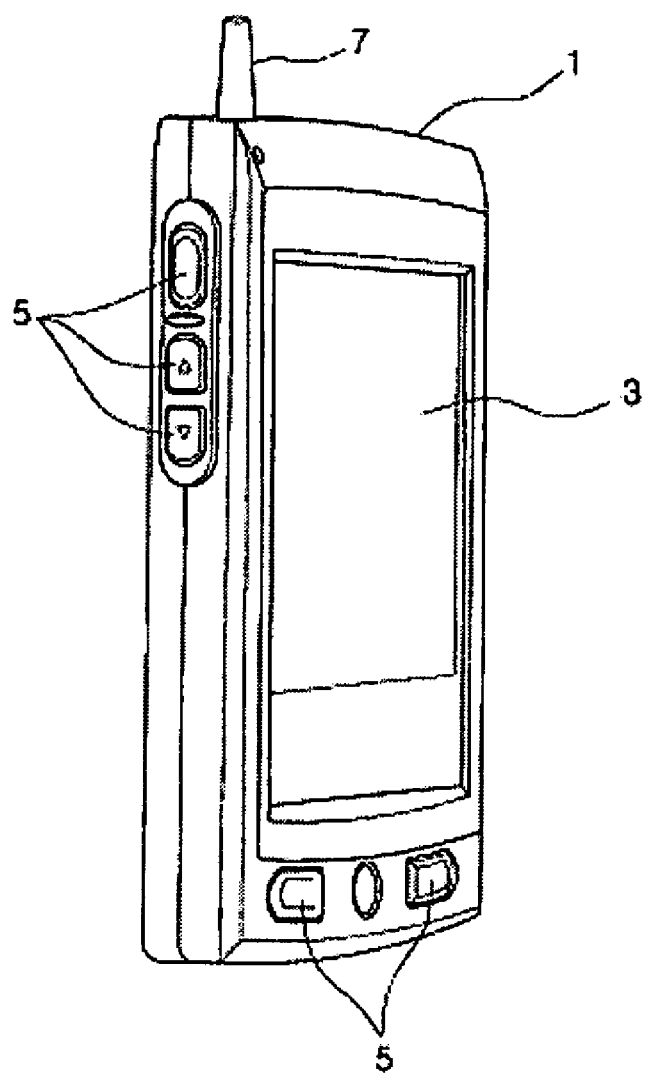
FIG. 1 is a diagram showing a perspective view of a prior art mobile device.
Figure 2:
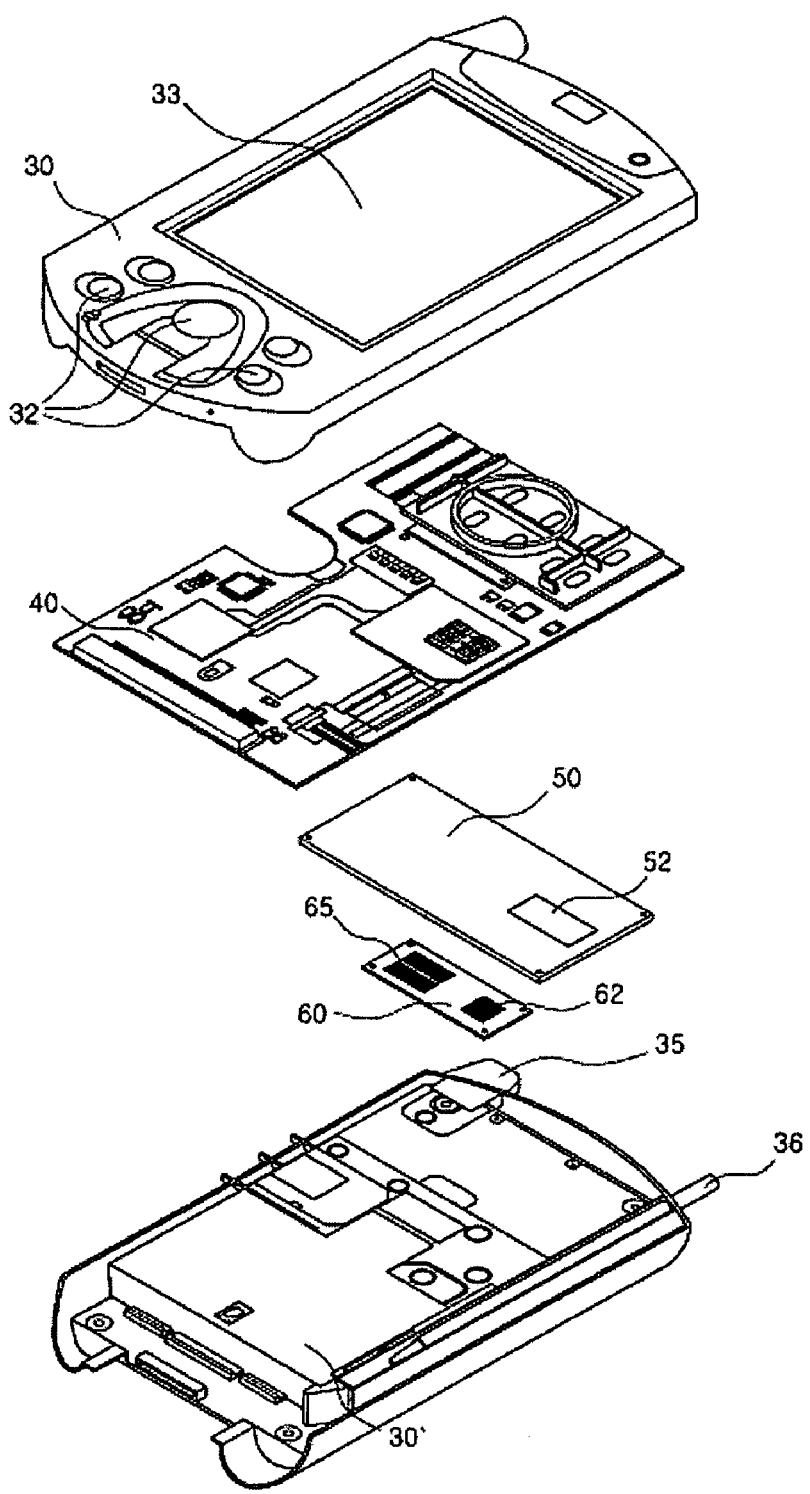
FIG. 2 is a diagram showing an exploded perspective view of a preferred embodiment of a heat dissipating structure for mobile device according to the present invention.
Figure 3:
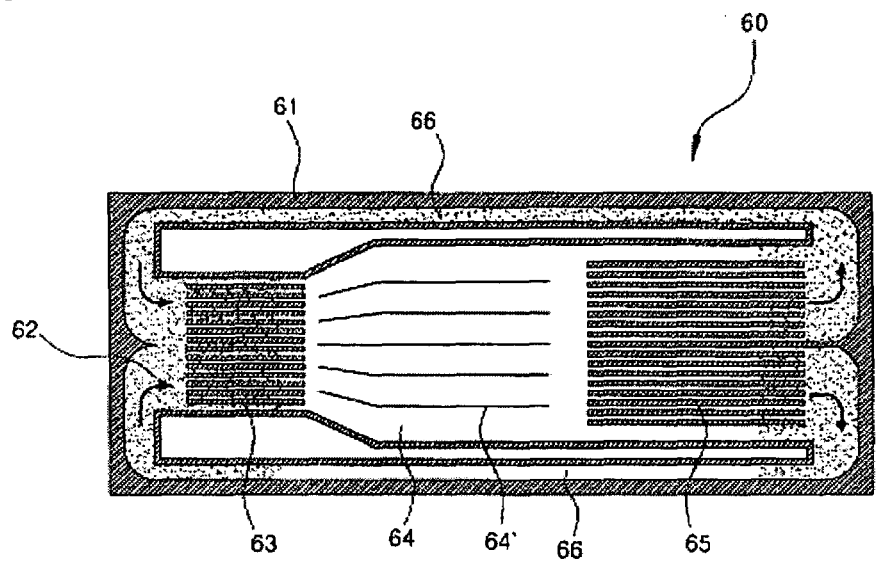
FIG. 3 is a diagram showing a sectional view of a micro-cooling unit in a preferred embodiment of the present invention.

FIG. 2 is a diagram showing an embodiment of a heat dissipating structure for a mobile device according to the present invention. FIG. 3 is a diagram showing a sectional view of an inner construction of a micro-cooling unit of FIG. 2.

As shown in FIG. 2, a front external appearance of a mobile device is formed by a front part of a case 30 and the rear external appearance thereof is formed by a rear part of the case 30'. A predetermined space can be formed between the front part of the case 30 and the rear part of the case 30'. The space is established with various kinds of components constituting the mobile device.

The front part of the case 30 can be provided with some buttons 32. The buttons 32 can be provided to turn on/off an electric supply of the mobile device, to control operations thereof or the like. Such buttons 32 can be provided on the side of the mobile device, on the front of the mobile device or the like.

The front part of the case 30 is preferably prepared with a screen 33 that is a display. The screen 33 is the part on which various kinds of information is displayed. Further, information can be input by an input device such as an input pen 36. Thus, the screen 33 has an input device (e.g., input pen 36) recognizing function so as to perform the aforementioned functions.

The upper end of the rear part of the case 30' can be provided with an antenna 35. The antenna 35 is useful for reception of a communication signal in the mobile device, especially having a communication function. The rear part of the case 30' can also be provided with the input pen 36 (e.g., a holder). Of course, the input pen 36 can be received into a space formed in the case 30, between the front part of the case 30 and the rear part of the case 30' or the like.

The space between the front part of the case 30 and the rear part of the case 30' can include a main board 40. The main board 40 is preferably a printed circuit board, on which many components are mounted. The main board 40 can also mount additional kinds of components constituting the mobile device.

The main board 40 can be mounted with a communication module 50 that performs the communication function. As for the communication module 50, there is a wireless module, a CDMA module or the like since various components can be used as long as the capabilities support the communication function of the module device. The communication module 50 is preferably mounted on the one side of the upper end of the main board 40.

Thus, the communication module 50 can be located in the space between the main board 40 and the inside of the rear part of the case 30'. The communication module 50 can generate much heat when in operation. A part of the communication modules 50 from which a majority of the heat is generated is illustrated as an exemplary heat generating part 52 in FIG. 2.

A micro-cooling unit 60 can be used for dissipating the heat generated from the communication module 50. Exemplary construction of the micro-cooling unit 60 is shown in FIG. 3. The micro-cooling unit 60 can have a shape of plate and stores a refrigerant or the like in the space therein to flow. A refrigerant storing part 62 for storing the refrigerant can be formed inside one end of the housing 61 of the micro-cooling unit 60.

A first heat exchanging part 63 can be formed in communication with the refrigerant storing part 62. The first heat exchanging part 63 can include a plurality of partitioned fluid passages in which the refrigerant flows so that the heat exchange can occur between the inner walls of the partitioned fluid passages and the refrigerant. A refrigerant flow fluid passage 64 can be provided at the position after passing through the first heat exchanging part 63. The refrigerant flow fluid passage 64 can have relatively wider cross-sectional areas than that of the heat exchanging part 63. The refrigerant flow fluid passage 64 can include a plurality of uniform flow guides 64' disposed side by side with a predetermined distance.

A second heat exchanging part 65 can be formed in connection with the refrigerant flow fluid passage 64. The second heat exchanging part 65 also can have a plurality of partitioned fluid passages in which the refrigerant can flow. Refrigerant returning fluid passages 66 for returning the refrigerant passing through the second heat exchanging part 65 can be formed along but separated from the refrigerant flow fluid passage 64.

The micro-cooling unit 60 described above can allow the refrigerant to absorb the heat of the outside, for example at the first heat exchanging part 63, and dissipate the heat at the second heat exchanging part 65 back to the outside. That is, the heat from the heat generating part 52 can be transferred to the first heat exchanging part 63 that is in contact (e.g., thermal contact) with the heat generating part 52 of the communication module 50 and dissipated to the outside by the second heat exchanging part 65.

When the rear part of the case 30' is made of a metallic material, the heat dissipated at the second heat exchanging part 65 of the micro-cooling unit 60 can be delivered to the outside (e.g., external) through the rear part of the case 30'. That is, if the rear part of the case 30' is made of the metallic material (or heat transferring material), the second heat exchanging part 65 of the micro-cooling unit 60 can be in direct contact with the rear part of the case 30'.

Figure 4:
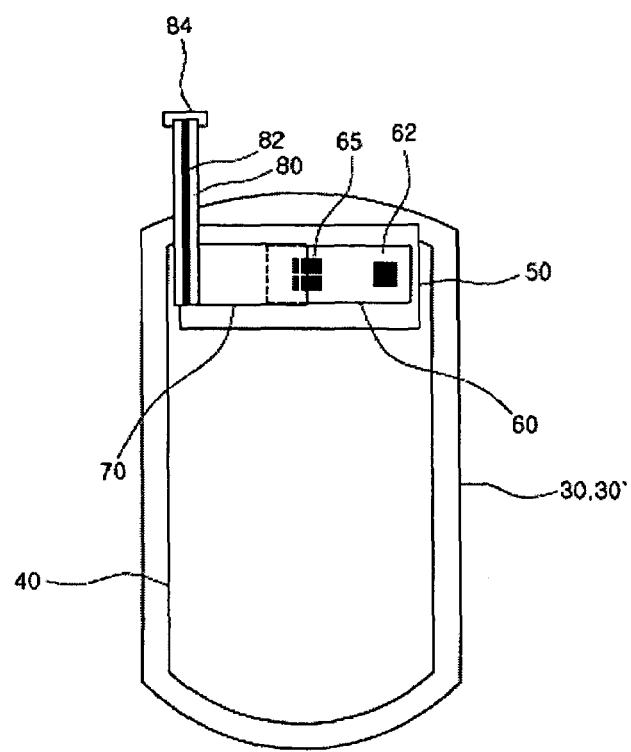
FIG. 4 is a diagram showing a schematic constructional view of another embodiment of the present invention.

FIG. 4 is a diagram that shows another embodiment of a heat transferring device and method for a mobile terminal according to the present invention. When the rear part of the case 30' is made of the non-metallic material (e.g., a non-heat transferring material), the heat transfer through the rear part of the case 30' to the external may not effective even though the second heat exchanging part 65 of the micro-cooling unit 60 is in thermal or direct contact with it. According to the embodiment of FIG. 4, heat out of the mobile device with rear part of the case 30' of a non-metallic material can be effectively dissipated.

To dissipate heat in the embodiment of FIG. 4, the first heat exchanging part 63 of the micro-cooling unit 60 can be in contact with the heat generating part 52 of the communication module 50 mounted on the main board 40. Then, a heat dissipating plate 70 can be established on the micro-cooling unit 60 so that the one side of the heat dissipating plate 70 can be in contact with the second heat exchanging part 65 of the micro-cooling unit 60. The heat dissipating plate 70 can be made of the same material as that of the housing 61 of the micro-cooling unit 60. However, the present invention is not intended to be so limited as other materials such as semiconductor materials may be used. Preferably, the heat dissipating plate 70 and the housing 61 are made of copper that has a good heat transfer rate.

The other side of the heat dissipating plate 70 can thermally couple with a heat pipe 80. Thus, the heat dissipating plate 70 thermally coupled to the heat generating part 52 can serve to transfer the heat between the heat pipe 80 and the micro-cooling unit 60. However, if the micro-cooling unit 60 can be designed to have enough length, the second heat exchanging part 65 of the micro-cooling unit 60 can to be in a direct contact with the heat pipe 80 without the heat dissipating plate 70. Alternatively, the heat dissipating pipe can be directly coupled between the heat generating part and the heat pipe 80.

The heat pipe 80 can extend out of the case 30 and 30'. Thus, the heat pipe 80 thermally couples the inside of the front and rear parts of the case 30 and 30' to the outside thereof, so that it becomes a path for dissipating the heat, which is generated from the communication module 50 or the like. The heat pipe 80 can look like an antenna with its external appearance. An antenna line 82, for example, can be provided to pass through the inside of the heat pipe 80. Other couplings between the heat pipe 80 and antenna line 82 are possible. For example, it is also possible to perform an antenna function by coupling the antenna line 82 made relatively thin to the external surface of the heat pipe 80. The leading end of the heat pipe 80 can be formed with an extension 84. The extension 84 is preferably provided for finally dissipating the heat carried on the heat pipe 84.

Operations of the heat dissipating structure of the mobile device according to embodiments the present invention described above will now be described. Heat dissipating will be described in connection with the embodiment illustrated in FIG. 2. When using the mobile device, especially when performing the communication using the communication module 50, much heat can be generated from the communication module 50.

The heat is generated the most especially from the heat generating part 52 in the communication module 50. The heat generated from the heat generating part 52 can be transferred to the first heat exchanging part 63 of the micro-cooling unit 60. This is because the heat exchanging part 63 is thermally coupled to or in a direct contact with the heat generating part 52.

The heat transferred to the first heat exchanging part 63 can be transferred to the refrigerant passing through the first heat exchanging part 63. Thus, the refrigerant can be vaporized to flow along the refrigerant flow fluid passage 64.

Subsequently, the second heat exchanging part 65 can transfer the heat to the one side of the rear part of the case 30' with which a corresponding part of the housing 61 can be thermally coupled to or contacting.

The refrigerant dissipates the heat and can be condensed at the second heat exchanging part 65. Then, it is delivered to the refrigerant storing part 62 through the refrigerant returning fluid passages 66 and continues to be delivered back to the first heat exchanging part 63 from the refrigerant storing part 62, so that the heat exchanging process can be repeated as described above.

In the embodiment illustrated in FIG. 4, heat can be transferred from the second heat exchanging part 65 of the micro-cooling unit 60 to the heat dissipating part 70. The heat transferred to the heat dissipating plate 70 can be transferred to the heat pipe 80 that thermally connects with the heat dissipating plate 70 and respectively protrudes out of the front and/or rear parts of the case 30 and 30'.

Thus, the heat transferred to the heat pipe 80 can be transferred to the outside of the front and rear parts of the case 30 and 30' along the heat pipe 80. Subsequently, some heat can be dissipated to the atmosphere through the external surface of the heat pipe 80 which is in contact with the atmosphere around the outside of the front and rear parts of the case 30 and 30'. The rest can be transferred to the leading end of the heat pipe 80 and finally dissipated to the outside through the extension 84.

Figure 5:
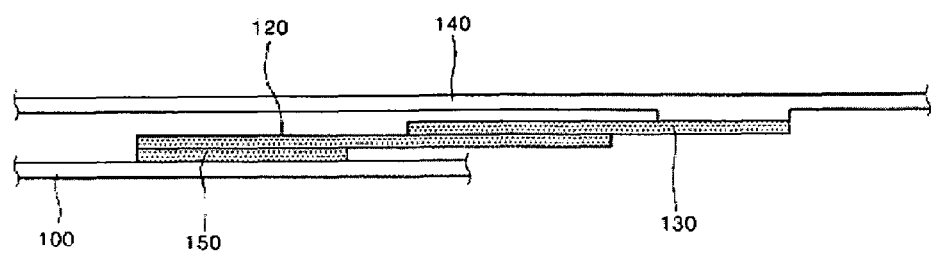
FIG. 5 is a diagram showing a schematic sectional view showing still another embodiment of the present invention.
Figure 6:
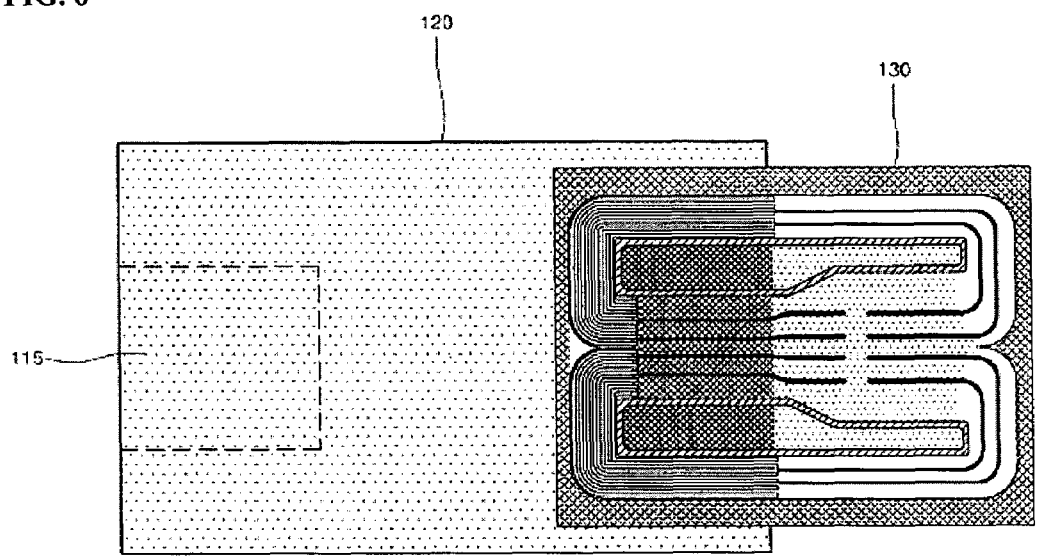
FIG. 6 is a diagram showing a plan view of a schematic construction of the embodiment of FIG. 5.
Figure 7:
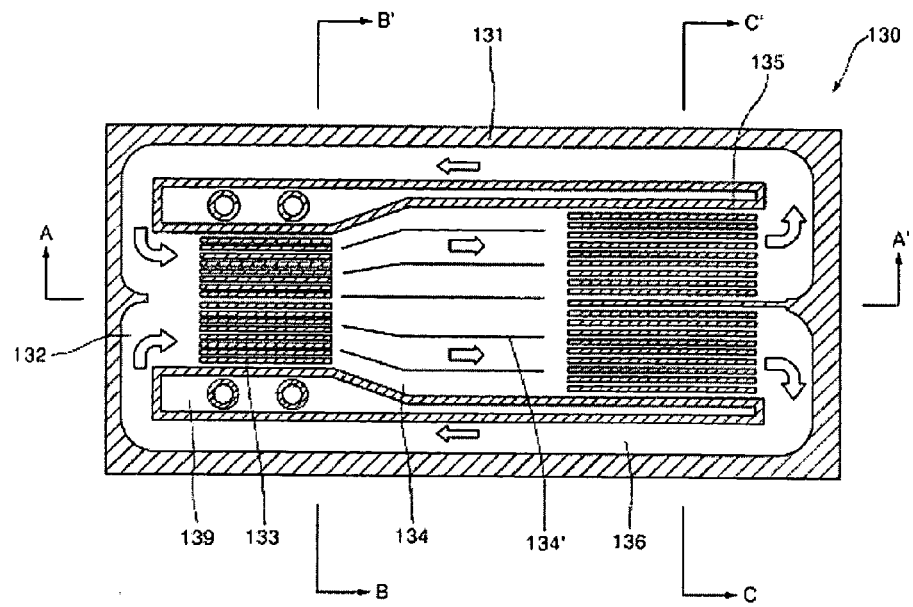
FIG. 7 is a diagram showing a transverse sectional view of the micro-cooling unit of FIG. 6.
Figure 8:
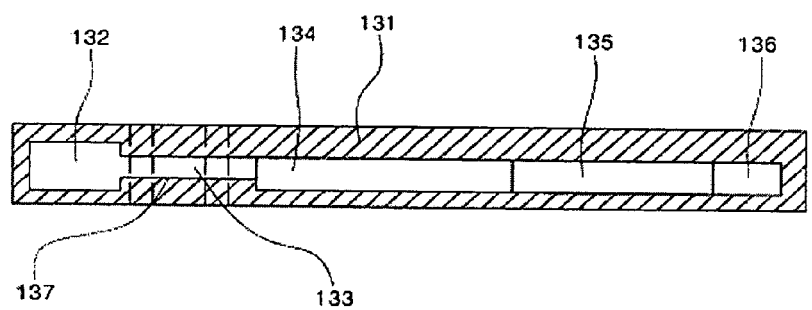
FIG. 8 is a cross sectional diagram taken along the lines A–A' of FIG. 7.
Figure 9:
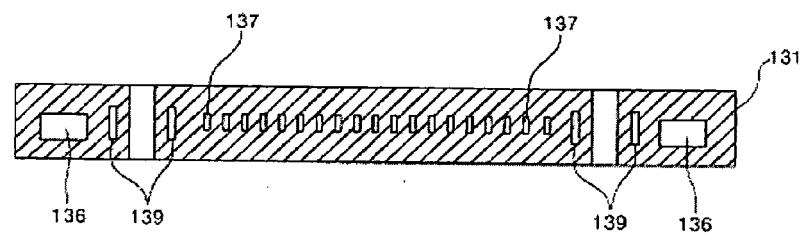
FIG. 9 is a cross sectional diagram taken along the lines B–B' of FIG. 7.
Figure 10:
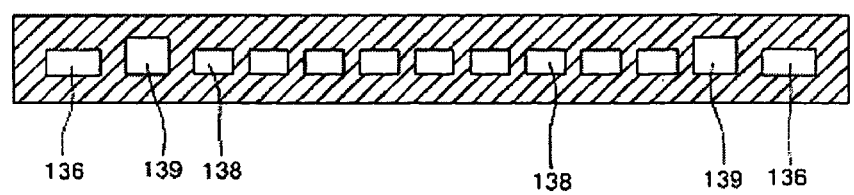
FIG. 10 is a cross sectional diagram taken along the lines C–C' of FIG. 7.

FIG. 5 is a diagram showing a cross sectional view of still another embodiment of a heat dissipating structure and method for mobile device according to the present invention, and FIG. 6 is a diagram showing constructions of the embodiment. FIG. 7 is a diagram showing the micro-cooling unit of FIG. 6. FIGS. 8 to 10 are cross sectional views taken along the lines A–A', B–B' and C–C' of FIG. 7, respectively.

As shown in FIGS. 5–10, a portable electronic device, for example a cellular phone, a PDA, a smart phone, a tablet computer, a notebook computer, etc., can mount a main board 100 therein. The main board 100 can be provided with the circuit and many kinds of components constituting the portable electronic device. The main board 100 preferably includes a microprocessor 115. The microprocessor 115 can be designated as a heat source (e.g., the greatest heat source) in the portable electronic device coupled to the main board 100. Thus, the microprocessor 115 can be CPU or a communication module.

The heat from the microprocessor 115 can be transferred to a phase change material part 120, using a PCM (Phase Change Material). The phase change material part 120 has characteristics of absorbing, storing and dissipating the heat, and includes the material of which phase is changed with temperature. The materials based on paraffin or on eutectic salts can be used for the phase change material part 120.

Since the phase change material part 120 requires much latent heat for the phase change at a special temperature, it can absorb the heat generated from the heat source in relatively large quantities at that temperature. Heat from the heat source can be effectively dissipated by establishing the phase change temperature of the phase change material part 120 in consideration of the heat generating characteristics of the microprocessor 115.

A micro-cooling unit 130 can be established on the one side of the phase change material part 120 so as to be in contact with each other or thermally coupled. As shown in FIGS. 8 to 10, a housing 131 of the micro-cooling unit 130 can have a shape of rectangular plate. However, the present invention is not intended to be so limited. The housing 131 can include a refrigerant circulating loop therein.

The housing 131 can be made of many kinds of materials. For example, the housing 131 can include semiconductor materials such as silicon or gallium, advanced laminating materials such as Self Assembled Mono-layer, metallic materials such as copper or aluminum with a good heat transfer rate and alloys thereof, ceramic materials, high molecular materials such as plastics, crystalline materials such as diamond, etc.

Heat resistance by the contact can be reduced or minimized by manufacturing the housing with the same material as that of the surface of the outside heat source. Thus, it is desirable that it be made of the same material as that of the surface of the phase change material part 120 or heat source 150.

It is possible to form the housing 131 in two layers with different characteristics (e.g., heat dissipation). Further, the housing can be formed integrally with the surface material of the external heat source in the manufacturing process of the semiconductor chip.

As for the refrigerant used for the micro-cooling unit 130, many kinds of refrigerants can be used therein. For example, when using water or a refrigerant based on alcohol, since the heat capacitance thereof is large and the contact angle to the inner wall of the semiconductor material due to the surface tension is small, the fluid velocity of the refrigerant becomes higher. Thus, it can have an advantage of transferring much quantity of heat.

A refrigerant storing part 132 can be provided inside of the housing 131 of the micro-cooling unit 130 at the one side thereof. A vaporization part 133 can be provided inside the housing in communication with the refrigerant storing part 132. A vaporized refrigerant flow part 134 can be provided in communication with the vaporization part 133, so that the refrigerant vaporized at the vaporization part 133 flows toward or through it. A condensation part 135 can be provided in communication with the vaporized refrigerant flow part 134. The condensation part 135 can be in communication with the refrigerant storing part 132 through a liquid state refrigerant flow part 136. The liquid state refrigerant flow part 136 can be formed along both ends of the housing 131 in the lengthwise thereof.

As shown in FIG. 9, the vaporization part 133 can be arranged with a plurality of first micro-channels 137 on the same plane. The vaporization part 133 evaporates the refrigerant filled in the first micro-channels 137 into a vapor state with the heat transferred from the phase change material part 120. The depth of the first micro-channels 137 can be formed shallower than that of the refrigerant storing part 132, as shown in FIG. 8. In the first micro-channels 137, the refrigerant in the liquid state stored in the refrigerant storing part 132 can flow from the refrigerant storing part 132 into the predetermined position of the first micro-channels 137 by the capillary phenomenon and the surface tension to the inner walls of the first micro-channels 137 such that the first micro-channels 137 can be partially filled with the refrigerant. The first micro-channels can be prepared to have the depth or the cross-sectional areas so that the surface tension in the first micro-channels 137 can be greater than the gravity.

The condensation part 135 can be formed on the same plane at the position separated from the first micro-channels 137 of the vaporization part 133 in the lengthwise by a predetermined distance. The condensation part 135 can be provided with a plurality of second micro-channels 138. As shown in FIG. 8, although the depth of the second micro-channels 138 can be formed greater than that of the first micro-channels 137, it is not necessary.

Further, in the second micro-channels 138, the refrigerant in the liquid state condensed and liquidized at the condensation part 135 can flow into the second micro-channels 138 by the capillary phenomenon and the surface tension to the inner walls of the second micro-channels 138 so that the refrigerant can fill the second micro-channels 138 to reach the predetermined position. The second micro-channels 138 can be formed to have the depth or the cross-sectional areas so that the surface tension in the second micro-channels 138 can be greater than the gravity. The greater volume of the condensation part 135 relative to the vaporization part 133 can help the refrigerant in vapor state within the condensation part 135 to be easily condensed also by the convection phenomenon in the surrounding conditions.

The cross section of the first fine and second micro-channels 137, 138 can be formed in a variety of shapes such as circular, rectangular, square, polygonal shapes as well as a rectangular shape. Further, it is possible to control intensity of the surface tension of the coolant with respect to the inner wall of the micro-channels by increasing or reducing the cross-sectional area along lengthwise direction. In addition, it is possible to determine moving direction of the coolant or control moving velocity of the coolant by forming a plurality of grooves in the inner wall of the first and second micro-channels 137, 138 or installing a plurality of nodes so that the cross-sectional area can change along the lengthwise direction.

To improve a heat emission effect, a plurality of pins can be formed in the outside of the housing 131 adjacent to the condensation part 135. In case that a plurality of the pins is formed, it may be also possible to operate to circulate the surrounding air by recycling the heat emitted to the outside from the condensation part 135. Further, in case that a plurality of the pins is formed using a fine structure that includes thermoelectric element(s), it is possible to obtain energy for use in fine operation by converting the heat emitted from into electric energy.

The vaporized refrigerant flow part 134 can be prepared between the vaporization part 133 and the condensation part 135. The vaporized refrigerant flow part 134 can include a plurality of guides 134' so that the refrigerant in vapor state can flow (e.g., uniformly) in the direction toward the condensation part 135.

The liquid state refrigerant flow part 136 can allow the outlet of the second micro-channels 138 and the refrigerant storing part 132 to be in communication with each other. The liquid state refrigerant flow part 136 and the vaporized refrigerant flow part 134 can be thermally and physically separated with each other by a heat shielding part 139.

The heat shielding part 139 can be formed in such a way that it is sealed in the inside of the housing 131 or it is opened at both the top and bottom of the housing 131. In case of being sealed in the inside of the housing 131, the heat shielding part 139 may maintain a vacuum state or preferably be filled with air or other insulating materials.

As shown in FIG. 7, the liquid state refrigerant flow part 136 can be positioned symmetrically in both directions along the outer periphery on both sides of the housing 131. The coolant circulation loop symmetrically formed along the outer periphery of such housing 131 can be very advantageous formed of a thin plate shape, particularly if its aspect ratio of the cross section is large. In that case, heat flow conducted and diffused also to the radial direction can be effectively convection-diffused over a larger area. Since it can be advantageous in subcooling the coolant in the channel and lowering the temperature at the entry of the vaporization part 133 by arranging two liquid state refrigerant flow part 136 along the peripheries of the micro-cooling unit 130, much thermal energy per unit mass flux can be delivered. Further, such dual direction circulation loop can be advantageous in that flowing of the coolant can be swiftly performed through the liquid state refrigerant flow part 136 in one side even in case that the micro-cooling unit 130 is so inclined that the gravitational positions are varied much with respect to each other and coolant circulation to the liquid state refrigerant flow part 136 in the other side is not properly performed.

The liquid state refrigerant flow part 136 can include at least a single third fine channels formed in such a way that the surface tension of the coolant of liquid phase with respect to the inner wall of the liquid state refrigerant flow part 136 is larger than the gravitational force lest the liquid state refrigerant flow part 136 should be influenced by the gravitational force. Thus, it is preferable to form a plurality of grooves (not shown) in a movement direction of the coolant of liquid phase, within or on the liquid state refrigerant flow part 136 or to separate the liquid state refrigerant flow part 136 into more than two third fine channels in order to reduce influence of the gravitational force.

It is also possible to additionally form a plurality of second guides (not shown) for guiding movement of the coolant of liquid phase at the boundary portions between the refrigerant storing part 132 and the liquid state refrigerant flow part 136, and between the condensation part 135 and the liquid state refrigerant flow part 136 so that flow can increase and damage generated due to rapid circling of the coolant flow can be reduced.

Heat absorption by vaporization part 133 and heat dissipation by the condensation part 135 can be on the same or opposite sides of the micro-cooling unit 130. Further, heat absorption or dissipation can be performed on both opposite sides of the micro-cooling unit.

As shown in FIG. 5, the external appearance of the portable electronic device can be formed by a case 140 that is thermally coupled with a dissipating side of the micro-cooling unit 130. Of course, it is not necessary that the micro-cooling unit 130 be thermally coupled with the case 140. Other thermal connections outside the portable electronic device from the micro cooling unit can be provided depending on the requirement in design.

Operations of the heat dissipating structure of the portable electronic device shown in FIGS. 5–10 will now be described. In the cooling device, heat generated from the microprocessor 115 that is the heat source can be transferred to the phase change material part 120.

The phase change material part 120 is delivered with the heat generated from the microprocessor 115 but does not transfer the heat to the micro-cooling unit 130 until the certain or prescribed temperature is reached. The reason is that the phase change material part 120 accumulates the heat to some degree.

The phase change material part 120 can continue to accumulate the heat until a phase change temperature of the material constituting the phase change material part 120 is passed. Such characteristics can be understood with reference to the graph shown in FIG. 11.

Figure 11:
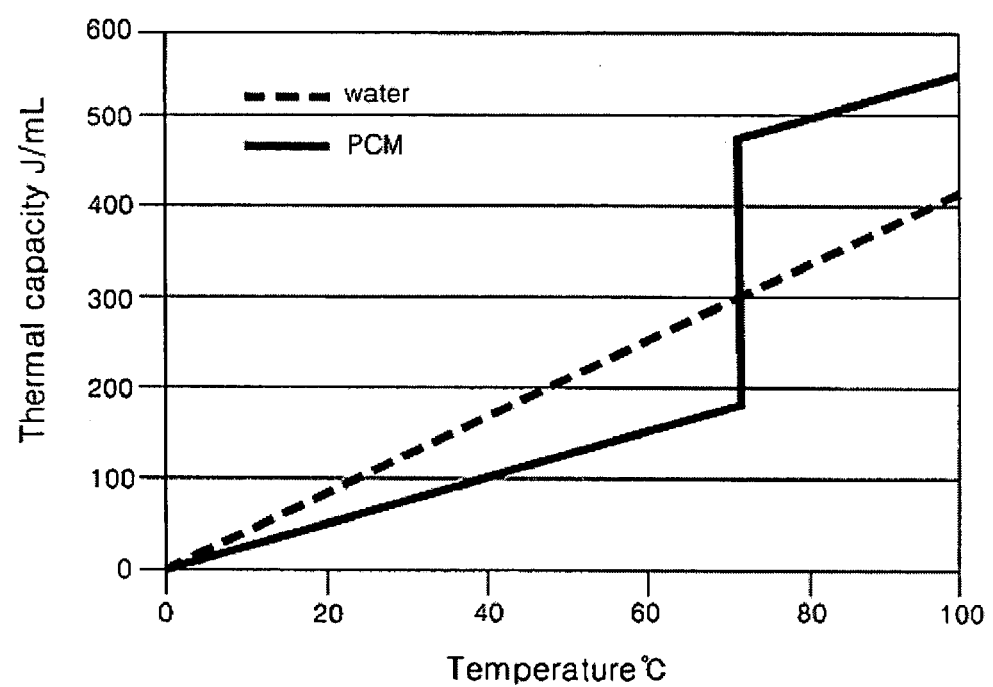
FIG. 11 is a graph showing characteristics of an exemplary phase change material part of the embodiments of FIG. 5.

As shown in FIG. 11, in case of water indicated by the dotted line in the graph, approximately linear variation values can be achieved at the temperature of 0° C. through 80° C. However, in case of a phase change material (PCM) constituting the phase change material part 120 indicated by the solid line, it can be understood that it continues to accumulate heat at near about 70° C. without the change of the temperature and then the temperature rises again. As a result, in the graph shown, as the temperature rises over 70° C., the heat transfer from the phase change material part 120 to the micro-cooling unit 130 can occur.

As the heat transfer from the phase change material part 120 to the micro-cooling unit 130 begins, the phase change of the refrigerant can occur within the micro-cooling unit 130. Thus, heat can be transferred from the one side of the micro-cooling unit 130 to the other side thereof.

That is, the heat transferred to the vaporization part 133 from the phase change material part 120 can evaporate the refrigerant. The vaporized refrigerant can be transferred to the condensation part 135 through the vaporized refrigerant flow part 134 and condensed in the condensation part 135 to dissipate the heat. The refrigerant condensed in the condensation part 135 can flow back to the refrigerant storing part 132 through the liquid state refrigerant flow part 136. The refrigerant returned to the refrigerant storing part 132 can be delivered to the vaporization part 133, so that it transfers the heat by repeating the aforementioned process.

The heat transferred to the condensation part 135 of the micro-cooling unit 130 can be transferred to the outside of the micro-cooling unit 130 and continues to be transferred to the outside of the portable electronic device. The heat can be transferred through, for example, the case 140.

Figure 12:
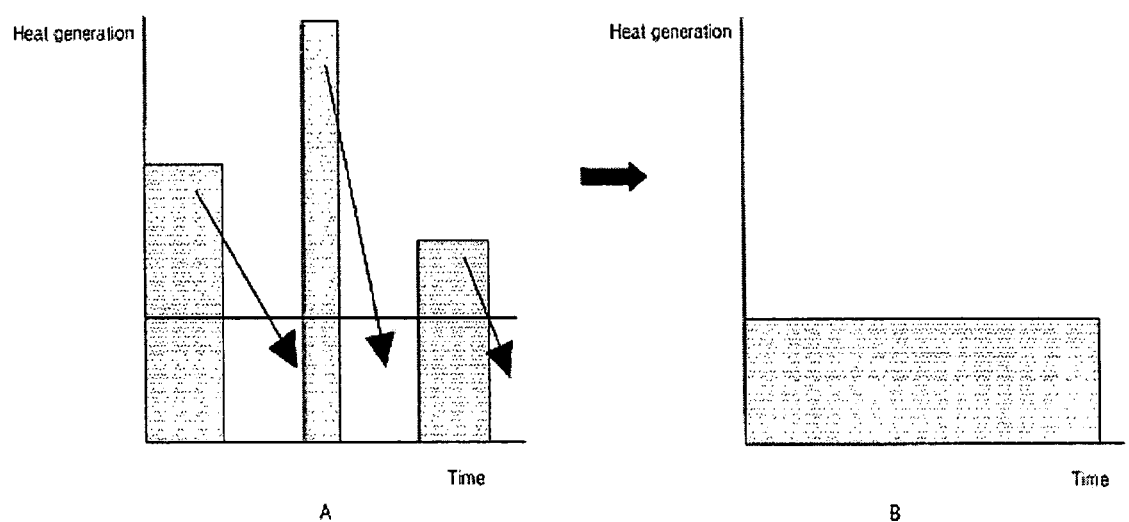
FIG. 12 is a graph showing exemplary heat dissipating characteristics of the embodiments of FIG. 5.

As shown in FIG. 12, if the heat is generated intermittently from the microprocessor 115 (e.g., see graph A), the characteristics as shown in graph B can be achieved since the phase change material part 120 accumulates the heat and transfers the heat when it has the temperature equal to or greater than the predetermined temperature. Thus, the heat transfer to the micro-cooling unit 130 does not occur until the phase change material part 120 has the temperature equal to or greater than the predetermined temperature by the heat transferred from the microprocessor 115 that is the heat source.

According to such heat transfer characteristics, when in a relatively small quantity of heat generation, the phase change material part 120 absorbs the heat generated from the heat source (e.g., the microprocessor). When the heat generation occurs over the predetermined quantity, the phase change material part 120 transfers the heat to the micro-cooling unit 130 to perform the dissipating operation.

Thus, the use of the phase change material part 120 can reduce the thermal load in the micro-cooling unit and especially reduce or prevent an abrupt thermal impact from being imparted to the micro-cooling unit 130. Therefore, effective heat radiation can be provided in consideration of the characteristics of both the phase change material part 120 and the micro-cooling unit 130 from the heat source. Further, the mobile device can perform or exhibit its every function as designed.

Any reference in this specification to "one embodiment," "an embodiment," "another embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

As described above, embodiments of a heat dissipating device and method for a portable electronic device according to the present invention have various advantages. For example, embodiments of a dissipating structure can actively dissipate the heat from a mobile device, especially having the communication function, to outside the mobile device. Further, embodiments can use a micro-cooling unit, so that the heat generated from the portable mobile device can be effectively dissipated. In addition, embodiments can use a heat pipe extending outside a case of the mobile device. Finally, a dissipating structure using a PCM material can operate in consideration of the heat generating characteristics to dissipate heat.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A mobile device for a mobile communication system, comprising:
    a case;
    a communication module mounted in the case that generates heat in connection with operations; and
    a heat dissipation system coupled to the communication module to reduce a temperature thereof during said operations, wherein the heat dissipation system comprises a heat pipe coupled to the communication module that extends to outside the case, and wherein an antenna separate from the heat pipe passes through an inner portion of the heat pipe.

2. The mobile device of claim 1, wherein said case is established with a main board therein, wherein additional components are mounted on said main board, and wherein said communication module is mounted on one side of said main board.

3. The mobile device of claim 1, wherein the heat dissipation system includes a heat exchanging part that is in direct contact with said case.

4. The mobile device of claim 1, wherein the heat dissipation system comprises a heat exchanging part is located to face toward an inside of the case that is opposite to said main board.

5. The mobile device of claim 1, comprising a heat dissipating plate that thermally connects said heat pipe with the communication module.

6. The mobile device of claim 1, comprising a heat transfer part including a phase change material that thermally connects to said communication module.

7. The mobile device of claim 1, wherein the communication module in contact with said heat pipe, and wherein said antenna passes through an opening in the case that includes the heat pipe without contacting the heat pipe.

8. The mobile device of claim 1, comprising a micro-cooling unit coupled between the communication module and said heat pipe having a refrigerant contained within a closed system that comprises,
    a coolant reservoir,
    a first heat exchanger coupled to the coolant reservoir configured to absorb heat through a thermal contact,
    a second heat exchanger operatively coupled to first heat exchanger that is configured to dissipate the heat,
    a liquid state refrigerant flow part coupled between the second heat exchanger and the coolant reservoir, and
    an insulation part configured to extend between the liquid state refrigerant flow part and each of the the first and second heat exchangers.

9. The mobile device of claim 8, wherein the insulation part includes gas or an insulating material, wherein the mobile device is a cellular phone, portable electronic device, a personal digital assistant (PDA) or a PDA phone.

10. A micro-cooling heat dissipation system, comprising:
    a housing having a refrigerant contained within a closed system, wherein the closed system comprises,
    a coolant reservoir,
    a first heat exchanger coupled to the coolant reservoir configured to absorb heat through a thermal contact,
    a second heat exchanger operatively coupled to first heat exchanger that is configured to dissipate the heat,
    a liquid state refrigerant flow part coupled between the second heat exchanger and the coolant reservoir, and
    an insulation part between the liquid state refrigerant flow part and each of the first and second heat exchangers.

11. The micro-cooling heat dissipation system of claim 10, wherein the insulation part includes gas or an insulating material.

12. The micro-cooling heat dissipation system of claim 10, wherein liquid state refrigerant flow part comprises a plurality of grooves that separate liquid refrigerant into a plurality of channels.

13. The micro-cooling heat dissipation system of claim 10, wherein two layers of heat dissipating materials comprise the micro-cooling heat dissipation system.

14. The micro-cooling heat dissipation system of claim 13, wherein said two layers have different heat dissipating characteristics.

15. The micro-cooling heat dissipation system of claim 10, wherein the first and the second heat exchangers comprise a plurality of capillaries.

16. The micro-cooling heat dissipation system of claim 10, wherein said micro-cooling heat dissipation system is provided with a first fluid passage in which the refrigerant flows from the first heat exchanger to the second heat exchanger, and wherein the refrigerant in said micro-cooling unit flows by a cooling cycle in which evaporation of liquid refrigerant occurs at the first heat exchanger and condensation of vaporized refrigerant occurs at the second heat exchanger.

17. The micro-cooling heat dissipation system of claim 10, wherein said closed system comprises a first fluid passage directly connecting the first and second heat exchangers, wherein a cross-section of the first fluid passage increases between the first and second heat exchangers.

18. The micro-cooling heat dissipation system of claim 17, wherein a cross-section of the first fluid passage increases in a first section configured to connect to the first heat exchanger and the cross-section of the first fluid passage is constant in a second section, and wherein the first fluid passage has a plurality of first guides forming channels extending along the first and second sections to separate flow of the refrigerant in a vapor state.

19. The micro-cooling heat dissipation system of claim 10, wherein the closed system comprises:
- a first fluid passage coupled between the first and second heat exchangers that has a plurality of first guides to separate flow of the refrigerant in a vapor state; and
- a plurality of second guides configured to guide movement of a liquid state refrigerant from an output end of the liquid state refrigerant flow part around the insulation part to the coolant reservoir.

20. The micro-cooling heat dissipation system of claim 19, wherein the closed system comprises:
- a plurality of third guides configured to guide movement of the liquid state refrigerant from the second heat exchanger around the insulation part to an input end of the liquid state refrigerant flow part, wherein the third guides are fewer in number than the second guides.

21. The micro-cooling heat dissipation system of claim 10, wherein the insulation part varies in size as it extends along the liquid state refrigerant flow part or is between the liquid state refrigerant flow part and the coolant reservoir.

22. The micro-cooling heat dissipation system of claim 10, comprising:
- a plurality of projecting pins formed outside the housing adjacent to the condensation part, wherein the plurality of pins comprise thermoelectric elements configured to generate energy by converting heat emitted through the housing.

23. A mobile terminal for a mobile communication system, comprising:
- a case;
- a device mounted in the case that generates heat in connection with operations;
- a heat dissipation system coupled to the device to reduce a temperature thereof during said operations, wherein the heat dissipation system includes a heat transfer part including a phase change material (PCM) part that effects phase changes when a predetermined temperature is reached by the heat transferred through the contact with said device; and
- a micro-cooling unit including a housing having a refrigerant therein, a first heat exchanging part for absorbing the heat through a thermal contact with the phase change material part and a second heat exchanging part for dissipating the heat, a liquid state refrigerant flow part coupled between the first and second heat exchanging parts, an insulation part between the liquid state refrigerant flow part and each of the first and second heat exchanging parts, wherein the first and the second heat exchanging parts comprise a plurality of capillaries.

24. The mobile terminal of claim 23, comprising a dissipating plate that thermally couples the second heat exchanging part with said case.

25. The mobile terminal of claim 23, wherein said phase change material part includes a material based on paraffin or a material based on eutectic salts.

26. The mobile terminal of claim 23, wherein the mobile terminal is a cellular phone, portable electronic device, a personal digital assistant (PDA) or a PDA phone.

27. The mobile terminal of claim 23, wherein the heat dissipation system comprises a heat pipe coupled to the device that extends to outside the case, and wherein an antenna separate from the heat pipe passes through an inner portion of the heat pipe.

28. A personal digital assistant (PDA), comprising:
- a display screen housed with in a case;
- an input device;
- an antenna;
- a controller operatively coupled to the display screen, the input device and the antenna; and
- a heat dissipation system coupled to the controller, comprising,
  - a housing having a refrigerant contained within a closed system, wherein the closed system comprises,
  - a coolant reservoir,
  - a first heat exchanger coupled to the coolant reservoir configured to absorb heat through a thermal contact,
  - a second heat exchanger operatively coupled to first heat exchanger that is configured to dissipate the heat,
  - a liquid state refrigerant flow part coupled between the second heat exchanger and the coolant reservoir, and
  - an insulation part between the liquid state refrigerant flow part and each of the coolant reservoir and the first and second heat exchangers, wherein the insulation part includes gas or an insulating material.

29. The personal digital assistant of claim 28, wherein the PDA is a cellular phone, portable electronic device, or a PDA phone.

* * * * *